(12) United States Patent
Noufer

(10) Patent No.: US 6,384,654 B1
(45) Date of Patent: May 7, 2002

(54) HIGH SPEED CIRCUIT OF PARTICULAR UTILITY IN DELAY AND PHASE LOCKED LOOPS

(76) Inventor: Glenn Noufer, 3030 Blodgett Dr., Colorado Springs, CO (US)

( * ) Notice: Subject to any disclaimer, the term of this patent is extended or adjusted under 35 U.S.C. 154(b) by 0 days.

(21) Appl. No.: 09/690,633

(22) Filed: Oct. 17, 2000

(51) Int. Cl.⁷ .............................................. H03H 11/26
(52) U.S. Cl. ...................... 327/276; 327/278; 327/170; 327/108; 326/80; 326/87
(58) Field of Search ................... 327/276, 277, 327/278, 170, 437, 108, 109, 110, 111, 112, 272, 285, 290; 326/80, 81, 82, 83, 85, 86, 87; 331/57

(56) References Cited

U.S. PATENT DOCUMENTS

| | | | | |
|---|---|---|---|---|
| 5,191,245 A | * | 3/1993 | Kang ......................... 327/170 |
| 5,239,274 A | * | 8/1993 | Chi .............................. 331/57 |
| 5,329,175 A | * | 7/1994 | Peterson ..................... 327/170 |
| 5,495,182 A | * | 2/1996 | Hardy ......................... 326/50 |
| 5,781,045 A | * | 7/1998 | Walia et al. ................. 327/170 |
| 5,952,891 A | * | 9/1999 | Boudry ........................ 331/57 |
| 6,028,450 A | * | 2/2000 | Nance .......................... 326/81 |

* cited by examiner

Primary Examiner—Kenneth B. Wells
Assistant Examiner—An T. Luu

(57) ABSTRACT

A delay stage for use in a voltage-controlled delay chain of a delay locked loop or in a voltage-controlled ring oscillator of a phase locked loop has pullup and pulldown transistors driven by a first input to the delay stage, at least one of which is in series with a delay control transistor, and a second pullup and pulldown transistor gated by a second input to the delay stage. When used in a delay chain, the first input is driven by a signal that leads the second input to the delay stage.

16 Claims, 3 Drawing Sheets

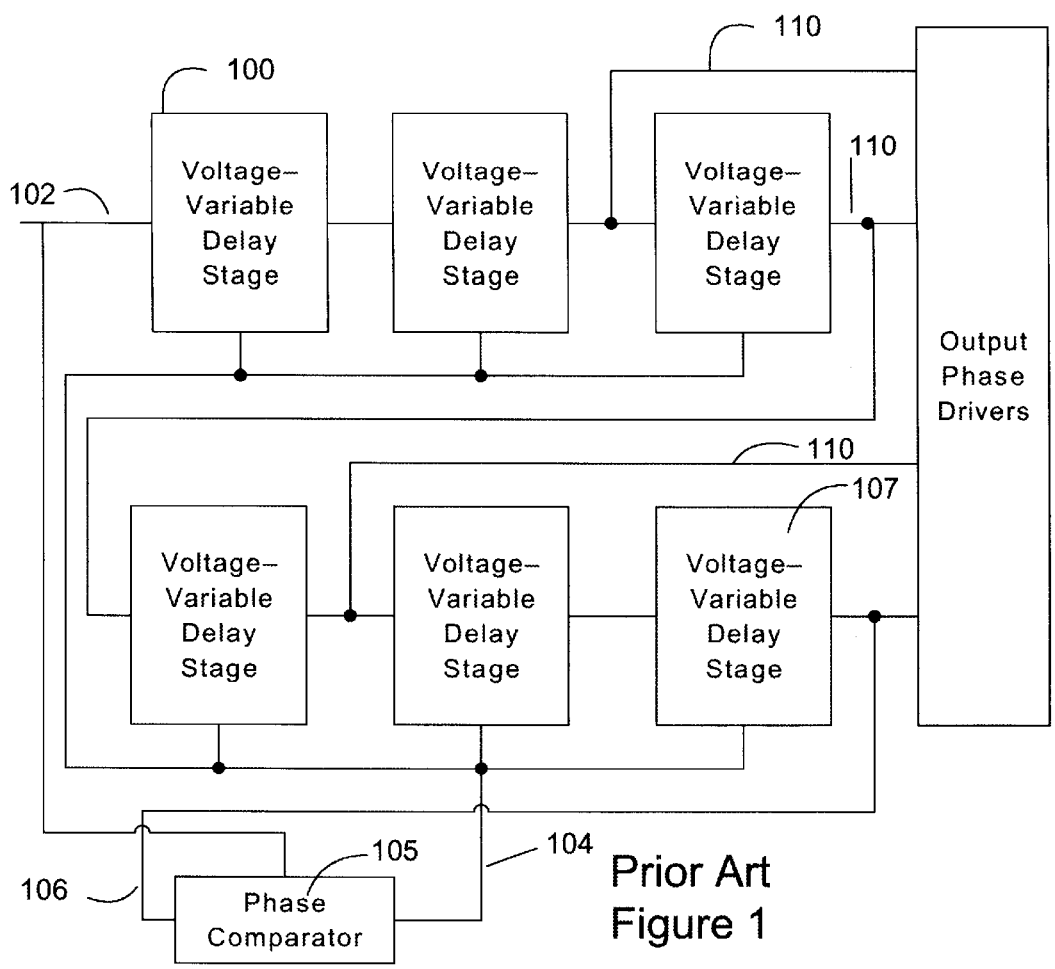
Prior Art
Figure 1
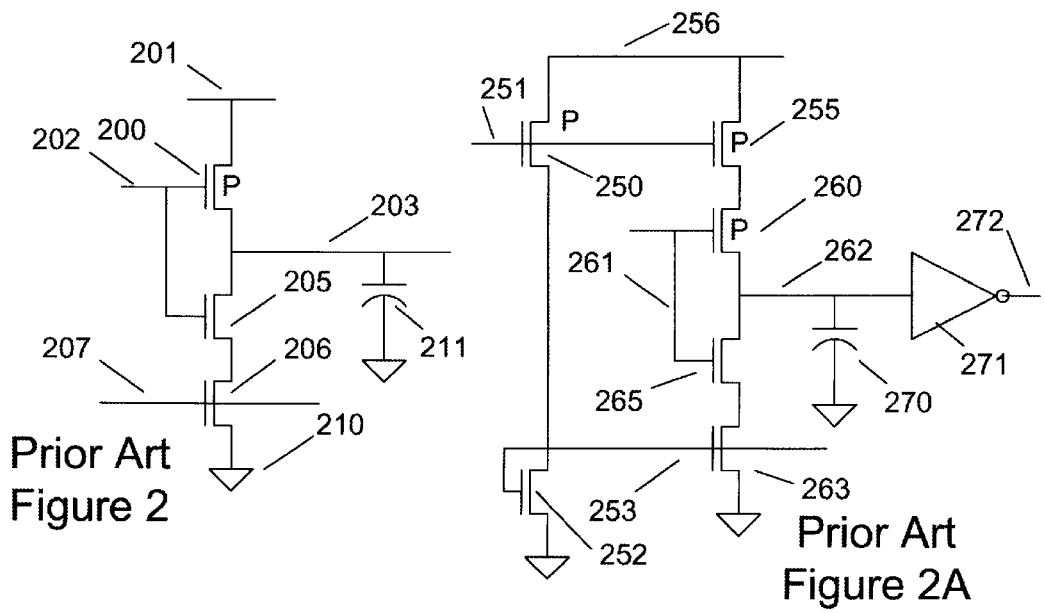
Prior Art
Figure 2
Prior Art
Figure 2A

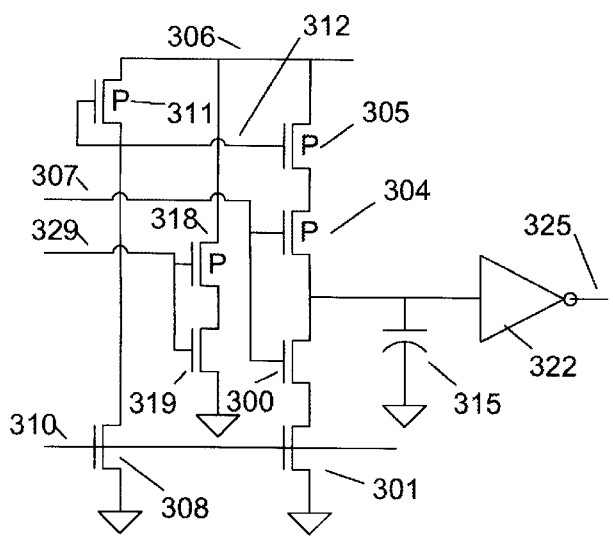
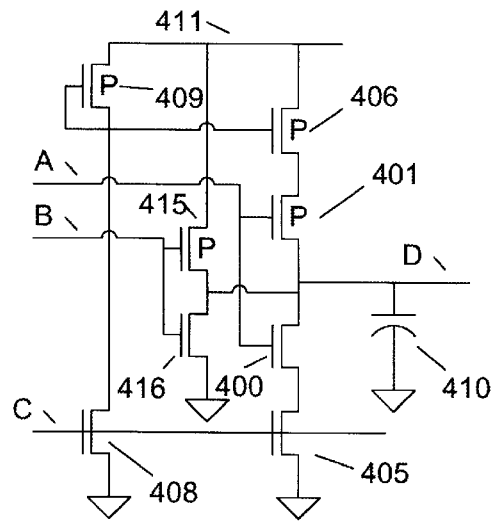
Figure 3
Figure 4
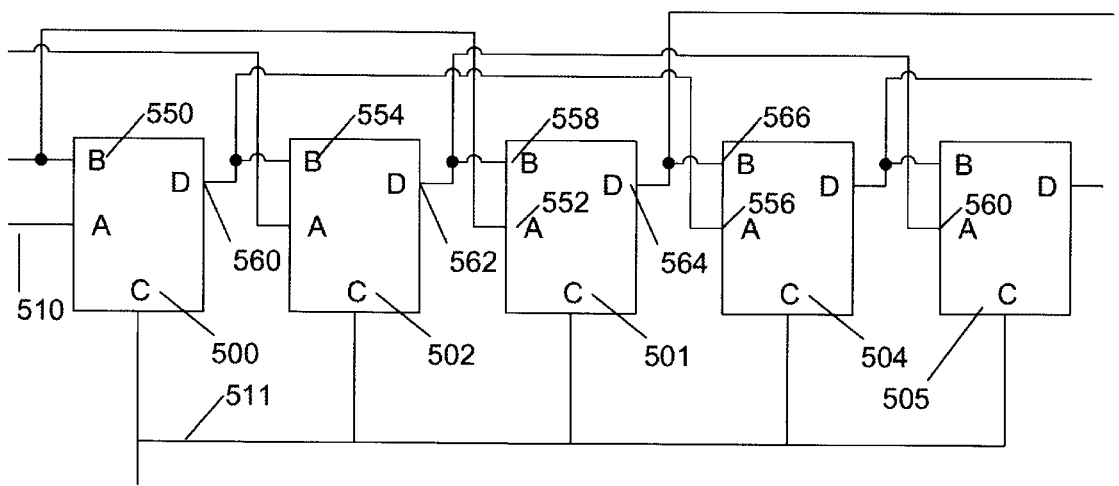
Figure 5
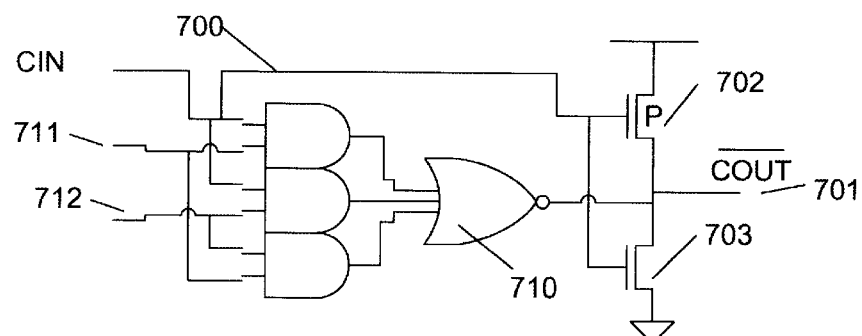
Figure 7

US 6,384,654 B1

HIGH SPEED CIRCUIT OF PARTICULAR UTILITY IN DELAY AND PHASE LOCKED LOOPS

The present invention relates to the art of high speed logic circuits, including the design of fast delay locked loops and phase locked loops. In particular, the invention relates to circuit techniques for fast logic or inversion stages in delay locked loops, phase locked loops, and carry chains.

BACKGROUND OF THE INVENTION

Internal multiphase clocks are common in modern high-speed integrated circuits; they are particularly handy in the design of memory elements of complex logic circuits. It is also common that multiphase clocks operate at frequencies that are a multiple of an input reference clock frequency.

On-chip phase locked loops are commonly used to generate high-speed internal clocks that operate at a multiple of a reference frequency. On-chip delay locked loops may be used to subdivide such high speed clocks into the desired multiphase clocks.

Commonly an on-chip delay-locked loop has a voltage-variable delay line having one or more voltage-variable delay stages. Multiphase outputs are often tapped from various points, separated by one or more of the voltage-variable delay stages, along the delay line. Typically, a delayed output from the voltage variable delay line is compared with a repetitive reference signal to generate a feedback voltage that adjusts the delay of the voltage-variable delay stages to lock that delayed output relative to the reference.

CMOS voltage-variable delay stages typically incorporate a pullup transistor and at least one pulldown transistor; there may also be a stage load capacitor in addition to the parasitic load capacitance of the devices and the input of the following stage. At least one, and occasionally both, of these transistors is controlled—it may be in series with an additional device that limits current through the pullup or pulldown transistor to a voltage-controlled value. Alternatively, the voltage swing of a gate of the pullup or pulldown transistor may be limited such that the current through the device is held to a controlled value.

For high-speed operation of a delay locked loop with narrow time differences between multiphase outputs, it is desirable that the delay of each stage be low. For example, if output phases A and B are to differ by N time when locked to a reference F, then it is desirable that N be an integer multiple of the voltage-variable stage delay S as trimmed by the feedback signal. If F is one GHz, with A and B separated in phase by 45 degrees, S should be an integer fraction of 125 picoseconds. Stage delays less than and equal to this magnitude are difficult to attain in prior-art voltage-variable delay stages.

It is also known that a voltage-controlled oscillator for use in a phase-locked loop may be built of voltage-variable delay stages connected in ring-oscillator configuration. Ring-oscillators of this type normally have an odd number of inverting delay stages, coupled in a loop where the last stage of the chain feeds the input to the chain. Alternatively, they may have an even number of inverting, or any number of noninverting, delay stages coupled with an inverter or inverting gate between the output of the delay chain and the input of the delay chain. Such oscillators often have provisions made for initialization of the delay chain.

SUMMARY OF THE INVENTION

A voltage-variable delay line suitable for use in high-speed delay-locked loops and ring oscillators of phase-locked loops has multiple voltage-variable delay stages. The voltage-variable delay stages use a feedforward path to ratioed pullup and pulldown devices, in parallel with pullup and pulldown devices of the delay stage, to provide faster and more consistent minimum propagation delays than achieved with voltage-variable delay stages of conventional design.

With feedforward devices as per the invention, the voltage-variable delay stages can be thought of as operating in a voltage-variable speedup mode, as opposed to the usual voltage-variable slowdown mode.

Feedforward devices similar to those of the voltage-variable delay stages have also been found useful for high speed logic gates, including ripple-carry chains.

BRIEF DESCRIPTION OF THE DRAWINGS

FIG. 1 is a block diagram of a delay-locked loop implementation of a multiphase clock generator;

FIG. 2, a schematic diagram of a voltage-variable delay-line stage of a prior-art delay-locked loop having a controlled pulldown;

FIG. 2A, a schematic diagram of a voltage-variable delay-line stage of a prior-art delay-locked loop having a controlled pullup;

FIG. 3, a schematic diagram of a non-inverting voltage-variable delay-line stage embodying the present invention;

FIG. 4, a schematic diagram of an inverting voltage-variable delay-line stage embodying the present invention;

FIG. 5, a block diagram of a delay-line or ring-oscillator segment using several inverting voltage-variable delay-line stages of FIG. 4;

FIG. 7, a schematic diagram of a carry chain stage embodying the present invention.

DESCRIPTION OF THE PREFERRED EMBODIMENTS

Figure 6:
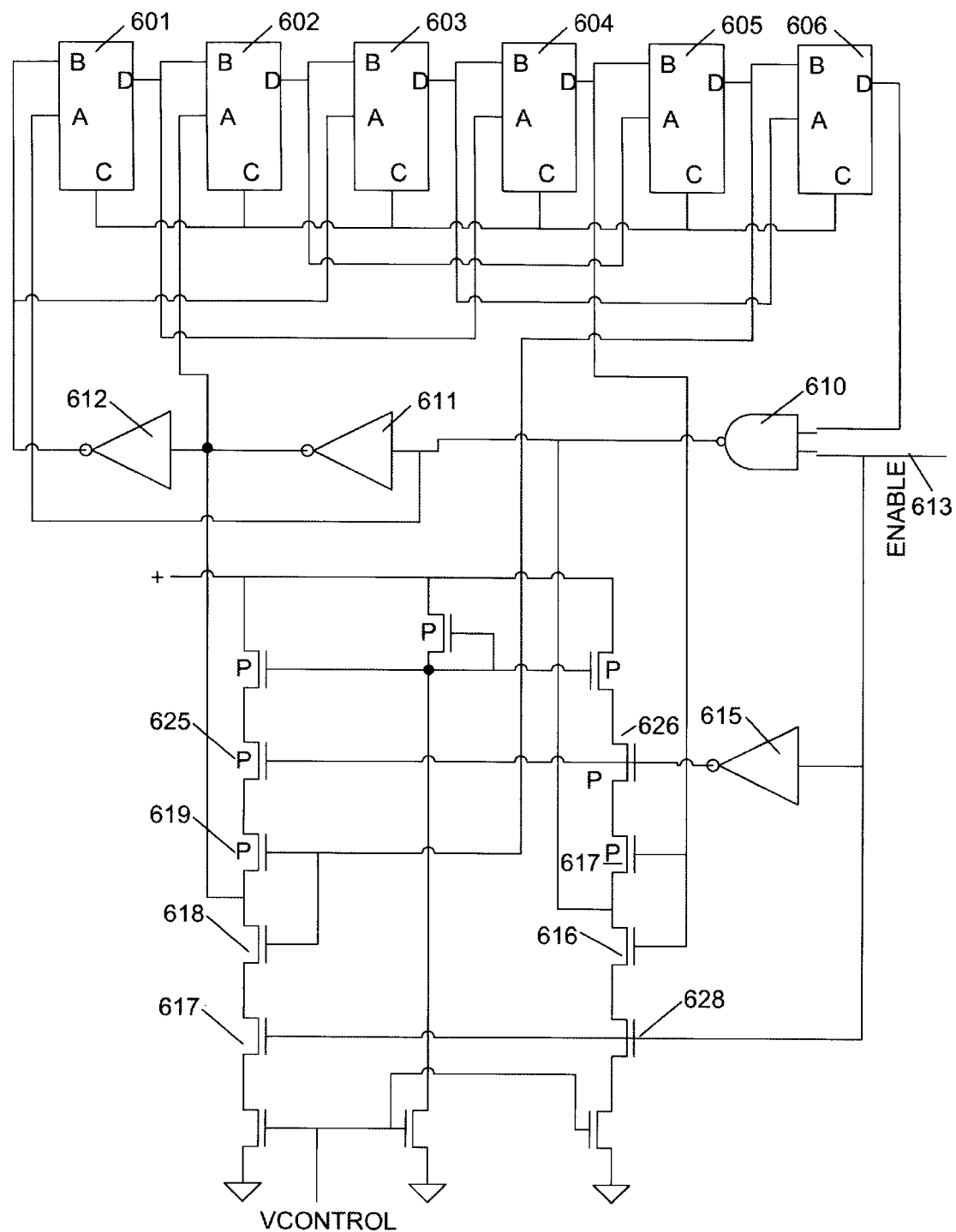
FIG. 6, a block diagram of a voltage-controlled ring oscillator having six stages of voltage-variable delay-line of FIG. 4 and an initialization gate.

In a multiphase clock generator embodying a delay-locked loop, there is typically a series of voltage-variable delay stages, such as voltage-variable delay stage 100 (FIG. 1). These are generally connected in series, although delay-locked loops having series-parallel configurations of identical or non-identical delay stages are known. Each voltage-variable delay stage 100 has a propagation delay that varies with a control voltage 101. An input signal 102, often known as the reference signal, typically feeds the first voltage-variable delay stage 100 of the series of voltage-variable delay stages and a phase comparator 105. An output 106 from a voltage-variable delay stage 107 of the series of voltage-variable delay stages is also fed to the phase comparator 105. The phase comparator 105 generates the control voltage 101, such that the actual delays of the voltage-variable delay-line stages track, and are a known fraction of, the input signal 102.

Delayed signals 110, which may include output 106, from one or more of the voltage-variable delay stages are buffered by output phase drivers 115 to provide outputs 116 of the multiphase clock generator.

A voltage-variable delay stage as is known in the art has a P-channel pullup transistor 200 (FIG. 2) connected to a power supply rail 201, an input signal 202, and a stage-delay output signal 203. There is also an N-channel pulldown transistor 205 connected to the stage-delay output signal 203, the input signal 202, and a current-setting transistor 206. Current setting N-channel transistor 206 is connected to the pulldown transistor 205, a control voltage 207, and the ground rail 210. There is also a stage capacitance 211, which may include a capacitor as well as the parasitic input capacitances of any output phase driver or voltage-variable delay stage that may be connected to the output signal 203. It is known in the art of integrated circuit design that such a delay stage will have a delay for the falling edges of signals that is a function of the control voltage 207.

Another voltage-variable delay stage known in the art has a current-mirror P-channel transistor 250 (FIG. 2A), connected and controlled by a first control voltage 251 and to an N-channel current-mirror transistor 252 to create a second control voltage 253. The first control voltage is also input to a P-channel current-setting transistor 255, as is the power supply rail 256. P-channel current-setting transistor 255 is connected through a P-channel pullup transistor 260, having the delay-stage input 261 on its gate, to delay node 262. Delay node 262 is also connected through N-channel pulldown transistor 265, having the delay-stage input 261 on its gate, to an N-channel current setting transistor 263. The maximum current through N-channel current setting transistor 263 is controlled by the second control voltage 253. As with the delay stage of FIG. 2, there is a stage capacitance 270. Delay stage output 272 may be taken directly from the delay node 262 or through an inverter 271 as shown. It is known in the art that a voltage-variable delay stage of this type will have a rising edge delay, and a falling edge delay, that is a function of the first control voltage 251, the various device sizes and characteristics, and the stage capacitance 270. Each such stage has a minimum stage delay that corresponds to a full-on level of the first control voltage 251.

Delay stages of the type shown in FIG. 2A are commonly built in complementary CMOS processes having enhancement-mode P and N channel device. With stages of this type, it is known that, on rising input, the output signal 272 will not begin to rise from the ground rail until the delay node 262 falls below a voltage one P-channel threshold voltage below the supply rail 256. Similarly, it is known that on falling input, the output signal 272 will not begin to fall until the delay node 262 rises above a voltage one N-channel threshold voltage above the ground rail. As such, it is difficult to design such stages with very fast minimum stage delays.

A delay stage embodying the present invention has an N-type pulldown transistor 300 (FIG. 3), in series with an N-type current-control transistor 301. It also has a P-type pullup transistor 304 in series with a P-type current-control transistor 305 to a supply voltage rail 306. These four devices 300, 301, 304, and 305 provide the voltage variability to the circuit. P-type pullup transistor 304 and N-type pulldown transistor 300 have gates controlled by an input signal 307 to the delay stage.

The N-type current-control transistor 301 and an N-type current-mirror transistor 308, which may be common to several delay stages, are driven by the control voltage 310. The N-type current-mirror transistor 308 cooperates with a P-type current-mirror transistor 311 to generate a second control voltage 312 for the P-type current-control transistor 305. Current mirror transistors 308 and 311 are referred to herein as a current mirror stack. There is also a stage delay capacitance 315, which includes the parasitic capacitances of a parallel inverter P-type pullup transistor 318 and an N-type output pulldown transistor 319, parasitic capacitances of transistors 300 and 304, input capacitance of a buffer inverter stage 322 and may further incorporate an intentional circuit capacitance.

In the delay stage of FIG. 3, the device sizes of the stage delay capacitance 315, and the transistors 300, 301, 304, 305, 318, and 319, are chosen such that, with the control voltage 310 at a lowest possible value, the delay from input 307 to output 325 is a maximum value suited to the application. Further, these device sizes are chosen such that, with the control voltage 310 at a maximum possible value, the delay from input 307 to output 325 is a minimum value suited to the application. Device sizes are chosen after circuit simulation using an analog circuit simulator as known in the art.

Circuit simulation of the delay stage of FIG. 3 shows that the delay for both rising and falling edges from delay stage input 307 to delay stage output 325 is a function of the control voltage 310. Further, this delay can be designed to be in a range suitable for voltage-variable delay stages of delay-locked and phase-locked loops. Circuit simulation, performed with HSPICE and parameters from both a 0.25 micron and a 0.35 micron CMOS process, shows that the minimum delay of the delay stage of FIG. 3 can be made smaller than that of a delay stage according to FIG. 2A having similarly sized pullup, pulldown, control, stage capacitance, and output inverter devices.

A multiphase clock generator operable at 622 MHz has sixteen inverting delay stages and is designed for fabrication in a 0.25 micron CMOS process. In this alternative embodiment, each stage has a pulldown transistor 400 (FIG. 4) and a pullup transistor 401, controlled by a first input A, and driving an inverted output D. The pulldown transistor 400 is coupled in series with an N-channel current-limiting transistor 405, which limits current through the pulldown transistor 400 to a maximum value controlled by a control input C. A first current-mirror transistor 408 and a second current-mirror transistor 409 generate a control voltage for a P-channel current-limiting transistor 406, which limits current through the pullup transistor 401 to a controllable value dependent upon the control input C. As with previously described stages, there is an effective stage delay capacitance 410.

In each stage, there is also a P-channel ratioed pullup transistor 415 that is coupled to drive the inverted output D from the power supply rail 411, having gate from a third input B that is timed to switch after input A. There is also an N-channel pulldown transistor 416 that is coupled to drive the inverted output D and having its gate connected to the third input B.

A segment of the delay chain of the 622 MHz DLL has several delay stages similar to those of FIG. 4. The B input, coupled to the uncontrolled devices, of each delay stage is coupled to the A input, coupled to the controlled devices, of the second following delay stage. For example, the B input 550 of the first delay stage 500 (FIG. 5) is coupled to the A input 552 of the third delay stage 501, the B input 554 of the second delay stage 502 is coupled to the A input 556 of the fourth delay stage 504, and the B input 558 of the third delay stage 501 is coupled to the A input 560 of the fifth delay stage 505. The signal present at the B inputs is therefore said to feed-forward to the A-inputs of the second following stage of the delay chain segment.

In this embodiment, the device sizes for the devices 400, 401, 405, 406, 415, 416, and 410 of each stage (FIG. 4) are chosen such that a logic transition of the D output of the stage does not happen until both the A and B inputs have arrived at the stage.

The B input of the first delay stage 500 (FIG. 5) is coupled to an input 510 of the segment, the D output 560 of the first delay stage 500 is coupled to the B input 554 of the second delay stage 502, the D output 562 of the second delay stage 502 is coupled to the B input 558 of the third delay stage 501, the D output 564 of the third delay stage 501 is coupled to the B input 566 of the fourth delay stage 504. The C or control inputs of all of the five stages of the illustrated delay chain segment are tied together and to a segment control input 511.

In the 622 MHz delay-locked loop, the A input of the first stage (not shown) of the entire set of sixteen stages is tied to the B input of that stage, and the A input of the second stage to an inversion of that input. It is expected that in a phase-locked loop voltage-controlled oscillator embodying the present invention, the A input of the first stage of the entire set of stages of the voltage-controlled oscillator will be tied to the D output of a late stage, such as the second-to-last delay stage, of the ring oscillator.

The A input of each delay stage therefore leads the B input, in that transitions of the A input occur somewhat before, and in the same direction as, transitions of the B input.

Circuit simulation of a delay chain segment of the 622 MHz delay-locked loop shows that each delay stage of the delay chain segment has a lower minimum voltage-controlled delay than that of a conventional delay stage design and this delay is predictable across voltage, process, and temperature variations.

A voltage controlled oscillator (VCO) embodying the present invention has six delay stages, 601, 602, 603, 604, 605, and 606 (FIG. 6) according to those of FIG. 4; coupled in a delay chain as described above and similar to that of FIG. 5. The output of the sixth delay stage 606 of the delay chain is fed back to the A input of the first delay stage 601 through a NAND gate 610 and two inverters 611 and 612. NAND gate 610 permits initialization of or disablement of the VCO for such purposes as IDDQ testing, or other testing of the integrated circuit upon which the oscillator is fabricated; the oscillator runs only if the ENABLE signal 613 is high. The inverters 611 and 612 provide delay to the B input of the first stage 601 such that a leading signal may be provided to the A input of the first stage 601.

An alternative embodiment of the VCO, having somewhat greater speed between the output of the sixth delay stage 606 and the A input of the first delay stage 601, has the above mentioned components, with the addition of an optional enable inverter 615, a ratioed feedforward pullup 616 and pulldown 617 coupled to the NAND gate 610 output, and a ratioed feedforward pullup 618 and pulldown 619 coupled to the output of inverter 611. The Enable signal 613 and the output of the Enable inverter 615 are coupled in series with switching devices 627, 628, 625, and 626 to permit turning off of the ratioed feedforward devices when the oscillator is not running.

In a ripple-carry adder stage, the most critical speed path is that from carry input to carry output. The carry section of a ripple-carry adder stage having an inverted carry output and embodying the present invention has a carry input 700 (FIG. 7) and carry output 701. A ratioed pullup 702 is connected between the carry output 701 and a power rail, with its gate connected to carry input 700. Similarly, a ratioed pulldown 703 is connected between the carry output 701 and a ground rail, with its gate connected to carry input 700. Suitable logic 710 performs the carry portion of an addition between a first operand input 711, a second operand input 712, and the carry input 700 and drives the inverted carry output 701; this logic 710 may take any of several logically equivalent forms and need not be implemented as the 3-wide 2-input AND-NOR shown.

While there have been described above the principles of the present invention in conjunction with specific embodiments thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

In particular, it is expected that the current mirror devices of the embodiment of FIG. 4 may be shared among several delay stages. Further, if the opposite polarity of control voltage is desired, the current mirror stack of this embodiment may be reversed.

What is claimed is:

1. A delay stage for use in a voltage-controlled delay chain of a delay locked loop or in a voltage-controlled ring oscillator of a phase locked loop comprising
    a first pullup transistor coupled to drive a stage output,
    a first pulldown transistor coupled to drive the stage output,
    a ratioed pullup transistor coupled to drive the stage output,
    a ratioed pulldown transistor coupled to drive the stage output, and
    a control transistor coupled in series with a transistor selected from the group of transistors consisting of the first pullup transistor and the first pulldown transistor;
    wherein the first pullup transistor and the first pulldown transistor each have a gate coupled to a first input to the delay stage and the ratioed pullup transistor and the ratioed pulldown transistor each have a gate coupled to a second input to the delay stage; and wherein the control transistor has a gate connected to a control voltage input of the delay stage.

2. The delay stage of claim 1, wherein the control transistor is in series with the first pullup transistor, and further comprising a second control transistor coupled in series with the first pulldown transistor, a gate of the second control being coupled to a second control voltage.

3. The delay stage of claim 2, wherein the second control voltage is derived from the control voltage input through a current mirror circuit.

4. The delay stage of claim 1, wherein the control transistor is in series with the first pulldown transistor, and further comprising a second control transistor coupled in series with the first pullup transistor, a gate of the second control transistor being coupled to a second control voltage.

5. The delay stage of claim 4, wherein the second control voltage is derived from the control voltage input through a current mirror circuit.

6. A voltage-variable delay chain for use in a delay locked loop or in a ring oscillator of a phase locked loop comprising at least one delay stage further comprising
- a first pullup transistor coupled to drive a stage output,
- a first pulldown transistor coupled to drive the stage output,
- a ratioed pullup transistor coupled to drive the stage output,
- a ratioed pulldown transistor coupled to drive the stage output, and
- a control transistor coupled in series with a transistor selected from the group of transistors consisting of the first pullup transistor and the first pulldown transistor,
- wherein the first pullup transistor and the first pulldown transistor each have a gate coupled to a first input to the delay stage and the ratioed pullup transistor and the ratioed pulldown transistor each have a gate coupled to a second input to the delay stage; and wherein a transistor selected from the group consisting of the first pullup transistor and the first pulldown transistor is coupled to a drain of the control transistor, the control transistor having a gate connected to a control voltage input of the delay stage; and
- wherein the first input of the delay stage is connected to a signal of the delay stage that leads the signal of the delay chain connected to the second input of the delay stage.

7. The voltage-variable delay chain of claim 6, wherein the at least one delay stage further comprises a second control transistor, a drain of the second control transistor being coupled to a transistor selected from the group consisting of the first pullup transistor and the first pulldown transistor.

8. A voltage-variable delay chain for use in a delay locked loop or in a ring oscillator of a phase locked loop comprising at least a first, a second, and a third delay stage, each delay stage comprising
- a first pullup transistor coupled to drive a stage output,
- a first control transistor coupled in series with the first pullup transistor and having a gate coupled to a first control signal,
- a first pulldown transistor coupled to drive the stage output,
- a second control transistor coupled in series with the first pulldown transistor and having a gate coupled to a second control signal,
- a second pullup transistor coupled to drive the stage output,
- a second pulldown transistor coupled to drive the stage output, and
- wherein the first pullup transistor and the first pulldown transistor each have a gate coupled to a first input to the delay stage and the second pullup transistor and the second pulldown transistor each have a gate coupled to a second input to the delay stage; and
- wherein the second input to the first delay stage is coupled to the first input of the third delay stage, the second input to the second delay stage is coupled to the output of the first delay stage, and the second input of the third delay stage is coupled to the output of the second delay stage.

9. The delay chain of claim 8, further comprising a fourth delay stage comprising
- a first pullup transistor coupled to drive a fourth stage output,
- a first control transistor coupled in series with the first pullup transistor and having a gate coupled to a first control signal,
- a first pulldown transistor coupled to drive the fourth stage output,
- a second control transistor coupled in series with the first pulldown transistor and having a gate coupled to a second control signal,
- a second pullup transistor coupled to drive the fourth stage output,
- a second pulldown transistor coupled to drive the fourth stage output, and
- wherein the first pullup transistor and the first pulldown transistor each have a gate coupled to a first input to the fourth delay stage and the second pullup transistor and the second pulldown transistor each have a gate coupled to a second input to the fourth delay stage; and
- wherein the second input to the fourth delay stage is coupled to the output of the third delay stage, and the first input to the fourth delay stage is coupled to the output of the second delay stage.

10. The delay chain of claim 9, wherein the second control input of the first delay stage is driven by a current mirror stack controlled by the first control input of the first delay stage.

11. The delay chain of claim 9, wherein the first control signal of the first delay stage is driven by a current mirror stack controlled by the second control signal of the first delay stage, and wherein the second control signal of the first delay stage is coupled to the second control signal of the second and third delay stages.

12. A voltage-controlled ring oscillator having at least a first, a second, and a third delay stage, each delay stage comprising:
- a first pullup transistor coupled to drive a stage output,
- a first control transistor coupled in series with the first pullup transistor and having a gate coupled to a first control signal,
- a first pulldown transistor coupled to drive the stage output,
- a second control transistor coupled in series with the first pulldown transistor and having a gate coupled to a second control signal,
- a second pullup transistor coupled to drive the stage output,
- a second pulldown transistor coupled to drive the stage output, and
- wherein the first pullup transistor and the first pulldown transistor each have a gate coupled to a first input to the delay stage and the second pullup transistor and the second pulldown transistor each have a gate coupled to a second input to the delay stage; and
- wherein the second input to the first delay stage is coupled to the first input of the third delay stage, the second input to the second delay stage is coupled to the output of the first delay stage, and the second input of the third delay stage is coupled to the output of the second delay stage.

13. A voltage-controlled ring oscillator having at least a first, a second, and a third voltage-controlled delay stage, each delay stage comprising:

a first pullup transistor coupled to drive a stage output, a first control transistor coupled in series with the first pullup transistor and having a gate coupled to a first analog control signal, a first pulldown transistor coupled to drive the stage output, a second control transistor coupled in series with the first pulldown transistor and having a gate coupled to a second analog control signal, a second pullup transistor coupled to drive the stage output, a second pulldown transistor coupled to drive the stage output, and wherein the first pullup transistor and the first pulldown transistor each have a gate coupled to a first input to the delay stage and the second pullup transistor and the second pulldown transistor each have a gate coupled to a second input to the delay stage;

wherein the second input to the first delay stage is coupled to the first input of the third delay stage, the second input to the second delay stage is coupled to the output of the first delay stage, and the second input of the third delay stage is coupled to the output of the second delay stage; and wherein a delay of the first, second, and third delay stages is variable with the first analog control signal and the second analog control signal.

14. A voltage-variable delay chain for use in a delay locked loop or in a ring oscillator of a phase locked loop comprising at least a first, a second, third, and fourth delay stage, each delay stage comprising a first pullup transistor coupled to drive a stage output, a first control transistor coupled in series with the first pullup transistor and having a gate coupled to a first analog control signal, a first pulldown transistor coupled to drive the stage output, a second control transistor coupled in series with the first pulldown transistor and having a gate coupled to a second analog control signal, a second pullup transistor coupled to drive the stage output, a second pulldown transistor coupled to drive the stage output, and wherein the first pullup transistor and the first pulldown transistor each have a gate coupled to a first input to the delay stage and the second pullup transistor and the second pulldown transistor each have a gate coupled to a second input to the delay stage;

wherein the second input to the first delay stage is coupled to the first input of the third delay stage, the second input to the second delay stage is coupled to the output of the first delay stage, and the second input of the third delay stage is coupled to the output of the second delay stage; and wherein the second input to the fourth delay stage is coupled to the output of the third delay stage, and the first input to the fourth delay stage is coupled to the output of the second delay stage.

15. A voltage-variable delay chain for use in a delay locked loop or in a ring oscillator of a phase locked loop comprising at least one delay stage further comprising a first pullup transistor coupled to drive a stage output, a first pulldown transistor coupled to drive the stage output, a ratioed pullup transistor coupled to drive the stage output, a ratioed pulldown transistor coupled to drive the stage output, and a control transistor coupled in series with a transistor selected from the group of transistors consisting of the first pullup transistor and the first pulldown transistor, wherein the first pullup transistor and the first pulldown transistor each have a gate coupled to a first input to the delay stage and the ratioed pullup transistor and the ratioed pulldown transistor each have a gate coupled to a second input to the delay stage; and wherein a transistor selected from the group consisting of the first pullup transistor and the first pulldown transistor is coupled to a drain of the control transistor, the control transistor having a gate connected to an analog control voltage input of the delay stage;

wherein the first input of each delay stage is connected to a signal of the delay stage that leads the signal of the delay chain connected to the second input of the delay stage; and wherein a delay of the delay chain is a function of the analog control voltage of at least one delay stage of the delay chain.

16. A voltage-controlled variable delay stage for use in a voltage-controlled delay chain of a delay locked loop or in a voltage-controlled ring oscillator of a phase locked loop comprising a first pullup transistor coupled to drive a stage output, a first pulldown transistor coupled to drive the stage output, a ratioed pullup transistor coupled to drive the stage output, a ratioed pulldown transistor coupled to drive the stage output, and a control transistor coupled in series with a transistor selected from the group of transistors consisting of the first pullup transistor and the first pulldown transistor;

wherein the first pullup transistor and the first pulldown transistor each have a gate coupled to a first input to the delay stage and the ratioed pullup transistor and the ratioed pulldown transistor each have a gate coupled to a second input to the delay stage; and wherein the control transistor has a gate connected to an analog control voltage input of the delay stage; and wherein a delay of the voltage-controlled variable delay stage is controlled by the analog control voltage input of the delay stage.

* * * * *